United States Patent [19]

Tanji et al.

[11] Patent Number: 4,849,146
[45] Date of Patent: Jul. 18, 1989

[54] METHOD FOR PRODUCING PYROLYTIC BORON NITRIDE ARTICLE

[75] Inventors: Hiroaki Tanji, Tokyo; Masaharu Suzuki, Machida; Kenji Nomura, Machida; Shojiro Watanabe, Machida; Takashi Kawasaki, Machida, all of Japan

[73] Assignee: Denki Kagaku Kogyo Kabushiki Kaisha, Tokyo, Japan

[21] Appl. No.: 42,148

[22] Filed: Apr. 24, 1987

Related U.S. Application Data

[62] Division of Ser. No. 831,247, Feb. 19, 1986, Pat. No. 4,690,841.

[30] Foreign Application Priority Data

Feb. 28, 1985 [JP] Japan .................................. 60-39532

[51] Int. Cl.$^4$ ............................................. B29C 41/22
[52] U.S. Cl. ..................................... 264/81; 427/255.2
[58] Field of Search ..................... 427/255.2, 237, 133; 264/81; 423/290

[56] References Cited

U.S. PATENT DOCUMENTS

| | | | |
|---|---|---|---|
| 3,152,006 | 10/1964 | Basche | 427/255.2 |
| 3,825,440 | 7/1974 | Branovich et al. | 427/255.2 |
| 4,058,579 | 11/1977 | Lashway | 427/255.2 |
| 4,385,080 | 5/1983 | Rudnay | 427/255.2 |

FOREIGN PATENT DOCUMENTS 596659  2/1978  U.S.S.R. .......................... 427/255.2

Primary Examiner—Sadie Childs
Attorney, Agent, or Firm—Jordan and Hamburg

[57] ABSTRACT

A pyrolytic boron nitride article of the invention has uniform structure and has 0.5 or less nodules/cm$^2$ in average all through the overall surface of the article and 2 or less nodules in any portion of the unit square centimeter on the surface of the article. The pyrolytic boron nitride article is produced by depositing boron nitride through a vapor phase, using a boron halide gas and an ammonia gas as the starting materials. Upon production, the ammonia gas or a gas mixture containing the ammonia gas is not contacted directly with graphite at 300° to 1850° C.

8 Claims, 1 Drawing Sheet

METHOD FOR PRODUCING PYROLYTIC BORON NITRIDE ARTICLE

This is a division of application Ser. No. 831,247, filed Feb. 19, 1986, now U.S. Pat. No. 4,690,841.

BACKGROUND OF THE INVENTION

The present invention relates generally to a pyrolytic boron nitride article and a method for producing the same, and more particularly to a pryolytic born nitride article adapted for use as a crucible for containing metals, such as epitaxy metals, in the evaporation process, as a boat for containing a material for semiconductor in the semiconductor growing process, as a jig, as a travelling wave tube support rod, as a material for forming a window passing microwave and infrared rays therethrough, and as a material for electric insulators.

Pyrolytic boron nitride is high grade boron nitride of high purity and used for wide industrial applications including crucibles for producing semiconductors and other special alloys.

Such pyrolytic boron nitride has been produced through the so-called chemical vapor deposition method, as disclosed by U.S. Pat. No. 3,152,006, wherein boron halide such as boron trichloride and ammonia are used as gaseous starting materials to deposite boron nitride at a temperature of from 1450° to 2300° C. and at a pressure of not more than 50 Torr, preferably not more than 1 Torr on the surface of an appropriate substrate or mold. Then, the deposited pyrolytic boron nitride is separated or released from the substrate to obtain an article made of self-standing pyrolytic boron nitride.

A self-standing article of pyrolytic boron nitride, such as a crucible or boat, which must have high mechanical strength may be prepared by the chemical vapor deposition method carried out normally at a temperature of from 1850° to 2100° C. In the thus prepared pyrolytic boron nitride, crystallization of boron nitride forms a laminar structure wherein the C-planes {(001) plane} of the crystal lattices are oriented in the direction close to the parallel direction to the surface of the substrate or mold. Accordingly, the article made of such pyrolytic boron nitride has a high mechanical strength in the direction parallel to the surface of the substrate with improved anticorrosive property and thermal stability. The properties of an article made of pyrolytic boron nitride are in close relation with the microstructure thereof.

Figure 1:
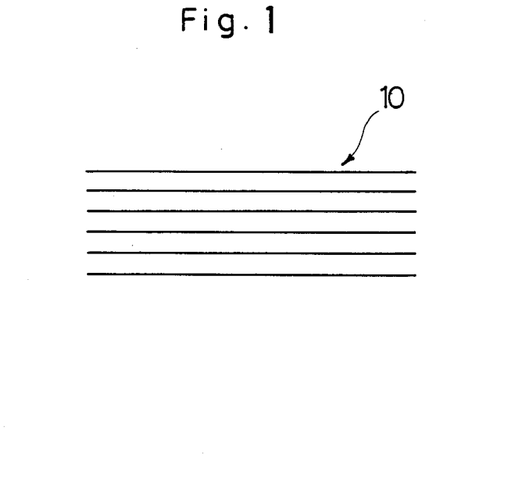
FIG. 1 shows a portion having a regularly oriented laminar structure.
Figure 2:
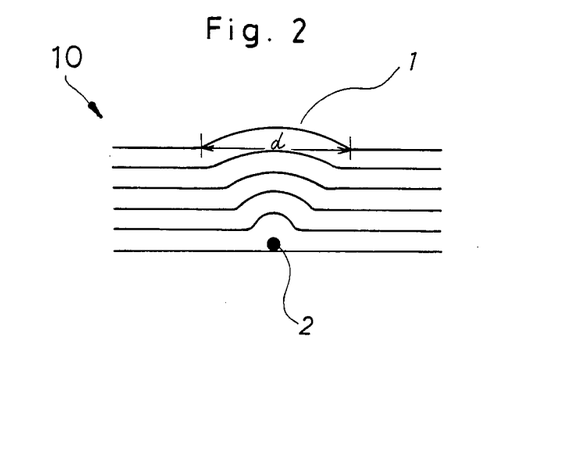
FIG. 2 shows a portion where the laminar structure is disarranged by a local hump of uneven structure.

We have found that a pyrolytic boron nitride article prepared through the conventional method has a microstructure in which the non-uniform portion exists in high density or ratio, which induces deterioration of the original properties of the pyrolytic boron nitride material. FIGS. 1 and 2 are simplified diagram delineated from microscopic photographs wherein a cross section 10 cut along a plane transverse to the deposition direction, i.e. the direction perpendicular to the peripheral face of an article made of pyrolytic boron nitride and prepared by the conventional method is photographed through a microscope. Referring to FIGS. 1 and 2, the cut cross-section 10 has portions or areas each being composed of plural layers of deposited pyrolytic boron nitride arranged uniformly (shown in FIG. 1), and portions swollen to form generally hemispherical small humps 1 whereat the laminated layers are locally disarranged as diagrammatically shown in FIG. 2. Examining such disarranged portions in detail, we have found that a generally spherical nucleus 2 having a diameter of about 5 to 50 μm is present at the center of each hump 1. Such hemispherical small humps are referred to as nodules throughout the specification and claims. The product prepared through the conventional method is ground by mechanical finishing to thus have a smooth surface. As a result, a number of small circular spots are found when observing the surface of a variety of commercially available pyrolytic boron nitride articles through a microscope, such spots being the traces of nodules.

Presence of such nodules or traces thereof causes serious disadvantages, such that they deteriorate the qualities of articles made of pyrolytic boron nitride to lower the mechanical properties, the thermal shock resistance and the lifetime when the article is used repeatedly. Details of such a nodule will be explained hereinbelow while referring to an exemplified case where a container made of pyrolytic boron nitride is used as a crucible for growing a single crystal compound semiconductor through the Liquid Encapsulated Czochralski method. In general, a pyrolytic boron nitride crucible is produced by depositing boron nitride over the surface of a graphite mold or substrate to form a pyrolytic boron nitride envelope (having a thickness in the order of 1 mm) and then separating the envelope from the mold. For this reason, the nuclei of nodules are present on the interior wall surface of the crucible, and tend to act as nuclei of crystal defects or sometimes contaminate a semi-conductor material, such as GaAs, during the step of melting the semiconductor together with a capsulant $B_2O_3$. Moreover, at the step of removing the cooled $B_2O_3$ from the crucible after the completion of crystal growth, some of the nodule nuclei could be plucked off from the interior surface of the crucible while adhering to the $B_2O_3$ mass to leave pinholes or to result in de-lamination of the crucible wall, leading to serious reduction in usable lifetime of the crucible. As to the traces of nodules, such portions appear as the areas where the protruding laminar structures (hemispherical small humps or nodules) have been planed by grinding or other means so that a cross-section of the laminate is exposed on the interior wall surface locally. Since the laminated pyrolytic boron nitride structure is structually weak or poorly integrated along the interfaces of respective layers, de-lamination tends to occur at such areas when subjected to repeated rapid heating and quenching cycles. In addition, the molten material contained in the crucible often impregnates in-between the interfaces of the laminate layers to pose another cause for de-lamination. In a square rod having an extremely small cross section of 1 mm square and a length of several tens of centimeters, as in the case of a support rod for a travelling wave tube for transferring a microwave, the nodules each having a diameter of about 0.1 to 1 mm affect the mechanical strength of the rod adversely due to irregularities in microscopic structure. The conventional pyrolytic boron nitride product has another disadvantage that metal impurities contained in the material for the crucible tend to migrate into a compound semiconductor during the step of growing the latter in the former, whereby the electric properties of the resultant compound semiconductor suffer significantly.

SUMMARY OF THE INVENTION

A principal object of this invention is to provide an article made of pyrolytic boron nitride containing a minimal amount of impurity and improved in mechanical property and thermal shock resistance and to provide a method for producing the same.

Another object of this invention is to provide an article made of pyrolytic boron nitride which is durable for a long lifetime even when it is subjected to repeated rapid heating and cooling cycles under severe conditions, and to provide a method for producing the same.

A further object of this invention is to provide an article made of pyrolytic boron nitride in which impurities or contaminants are prevented from being impregnated or migrated into a molten mass of semiconductor or other materials, and to provide a method for producing the same.

A still further object of this invention is to provide an article made of pyrolytic boron nitride which is almost free from disarranged or uneven portions causing dielectric breakdown to thus have improved dielectric breakdown strength, and to provide a method for producing the same.

According to the invention, there is provided a pyrolytic boron nitride article of uniform structure having a thickness of from 0.3 mm to 10 mm, the pyrolytic boron nitride being deposited through a vapor phase by the chemical vapor deposition method using boron halide and ammonia as the starting materials, the article having nodules and/or traces thereof on the surface, the number of nodules and/or traces thereof each having a diameter of not less than 100 μm being:

(a) 0.5 or less/cm² in average all through the overall surface of the article; and
(b) 2 or less in any portion of the unit square centimeter on the surface of the article.

The present invention also provides an improved method for producing a pyrolytic boron nitride article of uniform structure, comprising depositing boron nitride through a vapor phase at a temperature of from 1850° to 2100° C. in a reactor made of graphite, using a boron halide gas and an ammonia gas as the starting materials, and the improvement wherein the ammonia gas or a gas mixture containing the ammonia gas is not contacted directly with graphite at a temperature of from 300° to 1850° C.

These and other objects of the invention will become apparent from the following description.

BRIEF DESCRIPTION OF THE DRAWINGS

A cross-section of an exemplified article of pyrolytic boron nitride produced by the prior art method is depicted, in a delineated diagrammatical manner taken from microscopic photographs, in the appended drawings in which.

DETAILED DESCRIPTION OF THE PREFERRED EMBODIMENTS

After eager pursuits for overcoming the aforementioned disadvantages and problems of the prior art, we have found that the uniformity of structure of a pyrolytic boron nitride article depends greatly on the size and number of nodules or traces thereof, that nodules or traces thereof each having a diameter of 100 μm or more cause serious deterioration of a pyrolytic boron nitride article, and that a pyrolytic boron nitride article, which has less number of such nodules or traces thereof, has a satisfactory quality and long lifetime. It has been further found that even if the number of nodules of traces thereof present in a pyrolytic boron nitride is low, an unfavourable result is induced when they are concentrated locally.

Particularly, when the pyrolytic boron nitride is used as a material for a crucible in which a single crystal of a compound semiconductor is grown, it has been found that the lifetime of a pyrolytic boron nitride crucible and the quality of the compound semiconductor processed therein are in close relation with the properties of the crucible, and that the lifetime of the crucible can be prolonged and the quality of the compound semiconductor can be improved by controlling the properties of pyrolytic boron nitride within paticular ranges. Important parameters determining the properties of pyrolytic boron nitride include the following ones:

(1) C-axis Lattice Constant ($C_0$) of Boron Nitride Crystal (Hexagonal System Crystal) Forming the Crucible:

This constant indicates the crystallization degree of the boron nitride crystal, and as the crystallization degree increases the C-axis lattice constant approaches closely to the theoretical value.

(2) Crystallite Size of Boron Nitride in C-axis (Lc) Forming the Crucible:

This parameter indicated crystallite size, and the value of Lc is increased as the crystallite grows.

(3) Density of Pyrolytic Boron Nitride Article:

This parameter indicated the manner of crystal lattice arrangement or orientation, in addition to the size of unit crystal lattice, and a crystal made up of highly crystallized denser structure takes a higher value.

(4) Concentration of Silicon Contained in the Crucible:

There is a tendency that silicon is not sufficiently separated from boron trihalide, which is used as one of the starting materials in the present invention, to be left in the crucible material due to the fact that the boiling point of boron trihalide is approximate to that of silicon chloride. The lower is this parameter, the higher is the purity.

(5) Size of Microscopic Dome-like Structure Observed on the De-laminated Surface along the C-plane of Boron Nitride Crystal:

This is estimated as a parameter indicating or corresponding to the growth rate of crystal nucleus during the deposition of boron nitride from the vapor phase, as one of the characteristics observed in microscopic scale.

(6) Vickers Hardness (Hv) Measured by Applying Load through Vickers Indentor along the Direction Perpendicular to the Test Plane Extending Perpendicular to the Peripheral Wall of the Crucible Made of Laminated Pyrolytic Boron Nitride Layers:

This parameter indicates mechanical properties, particularly the hardness of the cross-sectional face including a plurality of boron nitride layers. As the hardness is higher, this parameter becomes larger.

(7) Length of Crack Formed by Applying Load through Vickers Indentor in the Direction Perpendicular to the Test Plane of the Test Conducted to Determine the Parameter of the Preceding Paragraph (6):

This parameter also indicates mechanical properties, particularly the bonding strength between respective layers of boron nitride crystal layers forming the laminar structure. As the bonding strength between adjacent layers increases, this parameter becomes small.

The parameters (6) and (7) described in paragraphs (6) and (7) are important factors determining the amount of pyrolytic boron nitride peeled during the step of removing $B_2O_3$ from the pyrolytic boron nitride crucible.

Each of the parameters referred to above will be described in detail hereinafter.

The pyrolytic boron nitride article, according to the present invention, is characterized by the fact that the number of nodules and/or traces thereof each having a diameter of not less than 100 μm is:

(a) 0.5 or less/cm² in average all through the overall surface of the article; and (b) 2 or less in any portion of the unit square centimeter on the surface of the article.

If the number of nodules and/or traces thereof each having a diameter of not less than 100 μm is more than 0.5/cm² in average all through the overall surface of a pyrolytic boron nitride article, unfavourable results are obtained in that the total areas of uneven or disarranged structure are increased, leading to deterioration of mechanical strength and reduction in thermal shock resistance. Even if the number of nodules and/or traces thereof each having a diameter of not less than 100 μm is 0.5 or less/cm², the portions having uneven or disarranged structure influence one another to pose problems such that slight de-lamination is propagated instantly by the adverse combined influences if the nodules or traces thereof are present concentratedly in a small local portion so that the number thereof in any one or more portion of the unit square centimeter on the surface of the article exceeds more than 2.

The size of nodules or traces thereof is defined by the diameters of respective hemisphere humps protruding from the surface of the article or the diameters of respective traces of such humps left on the finished surface of the article (see FIG. 2). A trace of nodule has a color tone different from that of other portions since stripes formed by plural layers are exposed on the surface of the article, and hence may be detected visually. Such a nodule is observed or detected more certainly by passing sunlight or a spot light through the wall of the article to form a clear stain- or spot-like image which can be easily observed, and the diameter thereof may be measured through a microscope of small magnification.

The diameter of a certain nodule or trace thereof depends on the size of the corresponding nucleus and the distance between the nucleus and the surface of the article, i.e. the depth of the nucleus, so that a larger nodule is formed on the surface of deposited pyrolytic boron nitride as the size of nucleus is larger and as the nucleus is present at a deeper position. The properties of a pyrolytic boron nitride article having a wall thickness of less than 0.3mm is not seriously affected by nodules or traces thereof, if present, since the depth of any nuclei inducing formation of nodules is not deep enough for forming large nodules. On the other hand, where the wall thickness of a pyrolytic boron nitride article exceeds 10 mm, the mechanical properties thereof are chiefly dominated by the internal stress of the article caused by thermal expansion anisotropy. Accordingly, the merits of the present invention are exhibited at the most, when the wall thickness of a pyrolytic boron nitride article ranges from not less than 0.3 mm to not more than 10 mm.

The method for producing a pyrolytic boron nitride article, according to the present invention, will now be described. Formation of the aforementioned nodules can be suppressed remarkably thereby to improve the properties of the product pyrolytic boron nitride article by an improved method. In depositing boron nitride through a vapor phase at a temperature of from 1850° to 2100° C. in a reactor made of graphite, using a boron halide gas and an ammonia gas as the starting materials, the ammonia gas or a gas mixture containing the ammonia gas and a boron halide gas is not contacted directly with graphite at a temperature of from 300° to 1850° C.

An article of crystallized pyrolytic boron nitride having high mechanical strength is produced generally at a pressure of not more than 50 Torr and at a temperature of from 1850° to 2100° C. The ordinary material for the reactor used in this step is graphite, since it is stable at high temperatures and can be purified so as not to contaminate the produce pyrolytic boron nitride. A graphite substrate acting as a core or mold, over which the product pyrolytic boron nitride is deposited, is hung or otherwise disposed in the reactor made of graphite, and the reactor is placed in a vacuum furnace maintained at a high temperature. One or more tubes for introducing gaseous materials are connected to the reactor, and gases are introduced through the tubes at constant rates. We have investigated the characteristics of various pyrolytic boron nitride products, particularly the number and conditions of nodules formed on the surfaces thereof in many cases where the constructions of interior parts of the furnace, the material for the furnace, temperature, pressure and the compositions of starting gases are changed. The results of our investigation revealed that flagrant nodules are formed when starting gases, particularly an ammonia gas or a mixed gas of ammonia and boron halide, contact directly with the graphite at a temperature of 300° to 1850° C. before they are introduced into the reactor. There has not been made clear the reason why serious nodules are formed under such conditions, but it is estimated that a very small amount of methane gas is produced by the reaction between the ammonia gas and the graphite at a lower temperature, and then the methane gas is thermally decomposed in the reactor to produce fine carbon particles on which pyrolytic boron nitride is deposited to form nuclei for nodules which are enclosed by the latter-made pyrolytic boron nitride layers. Even when the ammonia gas contacts with graphite at a temperature range of lower than 300° C., formation of nodules is not accelerated thereby due to the low reaction rate at such a temperature.

In the practice of the process of this invention, a tube for introducing the ammonia gas or a preliminary mixture of ammonia gas and boron halide into the reactor (the tube being referred to as starting material introduction tube) is made of a proper material other than graphite. Specific examples used for such purpose are refractory materials, such as high purity alumina, boron nitride molded by the hot press process, and the pyrolytic boron nitride per se, if the expense for the last-mentioned espensive material is acceptable. As a simpler and more effective measure, the starting material introduction tube made of graphite is prepared and then the portion thereof which could contact with the ammonia gas or a mixture of ammonia gas and boron halide gas is covered with a pyrolytic boron nitride coating for protecting from such adverse contact. This measure has the merits that a starting material introduction tube having any complicated shape for flowing the gas along a preferred flow path may be prepared easily, and that contamination of impurity from the tube can be prevented almost perfectly.

The pyrolytic boron nitride article produced by the process of the invention has a uniform structure wherein formation and growth of nodule is suppressed noticeably as compared with those obtainable by the conventional method. The product of the process of the invention is a self-standing pyrolytic boron nitride article having a thickness of from 0.3 to 10 mm and wherein the number of nodules or traces thereof in case of articles process through a surface finishing operation, of not less than 100 μm in diameter is (a) 0.5 or less/cm² in average all through the overall surface of the article; and (b) 2 or less in any portion of the unit square centimeter on the surface of the article. In other words, according to the present invention, an article not only has a small number of nodules or traces thereof but also does not have the nodules or traces thereof concentrated at any localized portion.

The pyrolytic boron nitride article provided by the invention may be used as a crucible for growing therein a compound semiconductor material. It is desirous that a crucible used for such purpose is produced by a process comprising the steps of depositing boron nitride from a vapor phase onto a substrate forming a mold for the crucible made of graphite, cooling the deposited boron nitride, and then separating the deposited boron nitride from the graphite substrate.

When the thus produced pyrolytic boron nitride article is used particularly for a crucible in which a compound semiconductor single crystal is grown through the Liquid Encapsulated Czochralski Method, it is desirous that the boron nitride crystal forming the crucible has a C-axis lattice constant of not more than 6.90 angstroms, with the crystal grain size in the C-axis of not less than 20 angstroms, a density of not less than 2.1 g/cm³ and an impurity silicon content of not more than 50 ppm.

Examples of compound semiconductors includes II-VI compounds, i.e. compounds of Group IIb elements of the periodic table, such as Zn, Cd and Hg with Group VIb elements of the periodic table, such as S, Se and Te, specific examples being ZnS, ZnSe, ZnTe and CdTe and mixed crystals such as $Cd_{1-x}Hg_xTe$; and III-V compounds, i.e. compounds of Group IIIb elements of the periodic table, such as Al, Ga and In with group Vb elements of the periodic table, such as P, As and Sb, specific examples being GaAs, GaP, InAs and InP and mixed crystals such as $Ga_{1-x}Al_xAs$ and $Ga_{x-}In_{1-x}P_yAs_{1-y}$.

If a crucible for growing therein a compound semiconductor is made of pyrolytic boron nitride having a C-axis lattice constant of more than 6.90 angstroms, having a crystal grain size in the C-axis of less than 20 angstroms, or having a density of less than 2.1 g/cm³, such a crucible may sometimes deteriorate in mechanical strength and thermal shock resistance during the repeated cycles, leading to a de-lamination. For this reason, the lifetime of such a crucible may be shorter. It is estimated that the microscopic structure of the pyrolytic boron nitride crystal is adversely affected by the presence of boron nitride crystals having insufficient crystallization degree, by the presence of extremely small crystals, or by the structural fault that crystal grains fail to pile up closely with one another.

In order to obtain such a favorable pyrolytic boron nitride, it is preferred that the chemical vapor deposition is effected at a deposition temperature of not lower than 1850° C. and at a deposition rate of not more than 400 μm/hr. If a crucible containing more than 50 ppm of silicon is sued for growing therein a compound semiconductor single crystal, the specific resistance of the product semiconductor is disadvantageously decreased to a level of less than $1 \times 10^7$ Ω·cm. The reason why silicon is particularly referred to amongst various impurities is that the boiling point of silicon chloride is close to the boiling point of boron trihalide used for the preparation of a crucible so that a relatively large amount of silicon chloride, as compared with other metal impurities, is left in the boron trihalide without being removed by the separation through distillation. In order to decrease the content of silicon in pyrolytic boron nitride to a level of not more than 50 ppm, it is preferred that a boron trihalide starting material having a purity of not less than 99.9% (and containing silicon at a content of not more than 50 ppm) is used and that graphite containing not more than 0.1 wt % of ash is used as the material for the stubstrate or mold.

The properties of the pyrolytic boron nitride crucible may vary readily by the measure described below. As a first measure, by changing the conditions for the chemical vapor deposition process, for example by raising the deposition temperature, the C-axis lattice constant $C_0$ may be decreased and the size and the density of crystal grain may be increased. As another measure, by increasing the quantities of starting materials fed within unit time, the C-axis lattice constant $C_0$ may be increased and the size and the density of crystal grain may be decreased.

With the aim to reducing the tendency that the pyrolytic boron nitride is peeled off from the wall of the crucible by repeated uses, there is preferably provided by this invention a pyrolytic boron nitride article including plural laminated layers, wherein the Vickers hardness (Hv) along the plane cut perpendicularly to the peripheral wall of the crucible is Hv (0.2/15)=62.0 or less, when measured by applying a loading of 200 grams through a Vickers indentor at an approaching rate of not more than 100 μm/sec for 15 seconds, and wherein the length of the longest crack formed along the plane cut perpendicularly to the peripheral wall of the crucible by the application of a loading of 1000 grams over a period of 30 seconds through a Vickers indentor is not more than 300 μm.

As has been described hereinbefore, when a crucible made of pyrolytic boron nitride is used as a vessel in which a compound semiconductor is grown through the Liquid Encapsulated Czochralski Method repeatedly, portions of interior pyrolytic boron nitride wall adhering to the $B_2O_3$ used as the encapsulant are peeled off or de-laminated from the interior surface of the crucible. Such a de-lamination depends on the mechanical properties of the boron nitride crystal which has a laminar structure.

More specifically, stress is developed internally of the crucible by the solidification and shrinkage of $B_2O_3$ to which boron nitride adheres, since $B_2O_3$ has a thermal expansion coefficient larger than that of boron nitride.

When the boron nitride layer has a hardness of some degree, rigidity is increased since the rigidity of a certain ceramic material is generally proportional to the hardness thereof, and thus the strain energy generated within the boron nitride layer is increased upon application of the stress correspondingly.

We have investigated the interrelation between the amount or degree of the de-laminated boron nitride layer and the Vickers hardness (Hv) measured by the aforementioned method while conceiving an idea that a softer crucible, the interior wall of which tends to adhere on $B_2O_3$ at the step of removing the $B_2O_3$, is less damaged by peeling or like breakdown since a softer material stores larger stress; and we have found that as the amount of de-laminated boron nitride layer is increased, the lifetime of the crucible may sometimes by reduced, upon repeated usage thereof as a crucible for the Liquid Encapsulated Czochralski Method, if the hardness of the crucible exceeds Hv(0.2/15) of 62.0.

On the other hand, since the crucible has a laminar structure, the aforementioned de-lamination also depends on the binding strength between the layers. In detail, we have considered that occurrence of de-lamination is diminished as the binding force between the boron nitride layers is increased and that the interlaminar binding force can be estimated by the determination of the length of cracking formed by applying a loading, for example, by a Vickers indentor in the direction parallel to the boron nitride layers. Bearing in mind the aforementioned consideration or estimation, we have tried to learn the interrelation between the amount of boron nitride peeled off at the operation of removing the $B_2O_3$ and the length of cracking caused by the application of loading effected as aforementioned, and found that such a crucible that suffers formation of cracking having a length of more than 300 μm by the application of loading of 1000 grams through the Vickers indentor is apt to release a large volume of peeled scale to result in reduction of lifetime.

It has been ascertained by our investigations that a crucible made of pyrolytic boron nitride having a Vickers hardness Hv of not more than 62.0, the length of the longest cracking formed by the aforementioned test method being not more than 300 μm, is produced by a chemical vapor deposition process effected preferably at a deposition or reaction temperature of not lower than 1900° C. and at a deposition rate of 300 μm/hr or lower.

More preferably, the C-axis lattice constant of the pyrolytic boron nitride forming the crucible may be not more than 6.80 angstroms and the minimal diameter of the microscopic dome-like structure observed on the plane de-laminated along the C-plane of the crystal may be not less than 0.5 μm.

In summary, we have conducted many investigations and experimental works with the aim to obtaining a crucible which can be used for a long lifetime under severe conditions. As the results of our investigations, we have found that the lifetime of a certain crucible made of pyrolytic boron nitride is closely related with certain properties of the material boron nitride, and that the crucible can be used for a prolonged lifetime under a stabilized state by controlling such properties within optimum ranges.

The following are the properties or parameters which have the closest interrelation with the lifetime of the crucible made of pyrolytic boron nitride. (The same numbers, as used in the preceding description, are given correspondingly to repsective parameters for easy reference.)

(1) C-axis lattice constant ($C_0$) of boron nitride crystal (hexagonal system crystal) forming the crucible; and (5) Minimum diameter (D) of a microscopic dome-like structure observed on planes de-laminated along the C-plane {(001)} of boron nitride crystal, for example, through a microscope having a magnification of more than 10,000 times. (Meantime, the observation conducted in such a manner will be referred to simply as "observation of the interlaminar surface".)

The C-axis lattice constant ($C_0$) referred to in (1) indicates the crystallization degree of a certain boron nitride crystal; and as the value of this constant decreases, i.e. approaches closely to the theoretical value (6.66 angstroms), it is shown that the crystal has a higher crystallization degree.

As the crystallization becomes higher, adjacent layers are arranged more closely. This is supported by the results of measuring the densities of pyrolytic boron nitride articles, which show that the density becomes higher as the value of $C_0$ becomes smaller.

A pyrolytic boron nitride having a higher crystallization degree and thus being composed of closely laminated layers has high mechanical strength, and is not easily suffering de-lamination or damages caused by de-lamination when used as a material for an article which is subjected to repeated heating and cooling cycles, as is the case of a crucible used in the Liquid Encapsulated Czochralski Method.

The size or minimum diameter of microscopic dome-like structure observed by the observation of the interlaminar surface of the boron nitride crystal, as aforementioned, is considered to indicate the crystal nucleus formation rate during the formation of pyrolytic boron nitride. In detail, a crystal nucleus is initially formed, and then the pyrolytic boron nitride grows around the nucleus to form a portion of the interlaminar surface, which portion reached onto the interlaminar surface is observed as a microscopic dome-like structure by the observation on the surface of the internal layer.

Accordingly, as the crystal nucleus formation rate becomes higher, the number of microscopic dome-like structures is increased and contrarily the size of each microscopic dome-like structure becomes smaller. It should be noted here that this microscopic dome-like structure is different from the nodule.

On the other hand, wave-like undulations are observed on the cross-section of each layer upon observation thereon through a microscope. The frequency of undulations depends on the minimum diameter of microscopic dome-like structure so that as the number of microscopic dome-like structures is smaller, the diameters of individual dome-like structures become larger to result in increase in wave height or depth of each undulation.

As the height of each undulation is increased, adjacent layers mesh more tightly with one another to increase the resistance to shearing and pulling force.

For example, when molten $B_2O_3$ is cooled to room temperature in a crucible made of pyrolytic boron nitride, occurrence of de-lamination of the pyrolytic boron nitride layers due to the influences of shearing and pulling forces applied at the interfaces thereof, (such forces being generated by the difference in thermal expansion coefficient between the pyrolytic boron nitride and the $B_2O_3$), is diminished as the minimum diameter of dome-like structure is increased with the increase in height of the undulations.

If a crucible used in the Liquid Encapsulated Czochralski Method for the purpose of growing therein a compound semiconductor has a C-axis lattice constant of more than 6.80 angstroms or has microscopic dome-like structures, which are observed on the interlaminar faces by the observation of the interlaminar surface, including those each having a diameter of less than 0.5 μm, the crucible is apt to be de-laminated upon removal of $B_2O_3$, to result in reduction lifetime. Futhermore, it is difficult to obtain crucibles of substantially constant lifetime.

This is because the mechanical strength of such a material is small due to the fact that the crystallization degree of the boron nitride crystal does not reach satisfactory level for ensuring dense lamination of adjacent layers, and because of the fact that the resistance to shearing and tension forces due to excessively high crystal nucleus formation rate leads to shallow and lose meshing or engagement between the adjacent layers.

In the pyrolytic boron nitride provided by the present invention, crystallization proceeds while satisfying both of the aforementioned characteristics concurrently to form a crystalline structure wherein plural layers are laminated closely to form a dense structure and adjacent layers engage or mesh with one another. With such structure, a crucible made of pyrolytic boron nitride of this invention is not easily de-laminated during the step of removing $B_2O_3$ used as the encapsulant in the method of growing a compound semiconductor, and thus can be used stably for a long lifetime.

The properties of the pyrolytic boron nitride product may be controlled by the following manner. In one aspect, the C-axis lattice constant ($C_0$) may be decreased by changing some reaction conditions in the process for the production of pyrolytic boron nitride, for instance, by raising the deposition temperature. The size of microscopic dome-like structure may be increased by lowering the pressure at the deposition step.

It is noted here that the value of $C_0$ tends to be increased, with the reduction in size of microscopic dome-like structures, by the increase of feed rate of the starting materials per unit time and by raising the deposition rate.

It will be further noted here that both of the characteristics referred to above are not attainable unless the deposition condition is set to a temperature of not less than 1900° C., with the degree of vacuum of not more than 20 Torr, and the deposition rate is set to a level of not more than 300 μm/hr.

The results of our investigations conducted in view of another aspect with the aim to prolonging the lifetime of a crucible made of pyrolytic boron nitride have revealed that the amount of crucible material peeled from the bottom of the crucible after the completion of the first pulling-up operation affect greatly the subsequent lifetime of the crucible, that the lifetime of the crucible is longer as the amount of peeled crucible material is small, and that the amount of peeled crucible material is in close relation with the inner surface roughness on the interior wall thereof.

Accordingly, the lifetime of a crucible may be further prolonged by controlling the maximum inner surface roughness $R_{max}$ (measured by the JIS R 0610 Method) of the crucible made of pyrolytic boron nitride formed by the chemical vapor deposition method while using boron halide and ammonia as the starting material gases so that the maximum inner surface roughness $R_{max}$ takes a value of $R_{max} \leq 350$ μm.

To obtain a crucible satisfying the criterion described in the preceding paragraph, the inner surface of a pyrolytic boron nitride crucible may be ground, using #200 or finer sand paper or other appropriate grinding means, to have a maximum roughness $R_{max}$ of 350 μm or less, preferably from 1 to 100 μm.

In the present invention, the inner surface roughness $R_{max}$ is defined to be 350 μm or less, for the following reason. If the $R_{max}$ exceeds 350 μm, wall thickness peeled after a single usage cycle amounts to 150 μm or more and the peeling or de-lamination occurs locally so that the damage appearing at such de-laminated portion is getting worse to reach an undurable state for further usage after about 10 cycles.

As has been elucidated by the foregoing description, an article made of pyrolytic boron nitride and having improved mechanical properties and thermal shock resistance is provided by improving homogeneousness or regularity of the structure according to this invention. When an article produced in accordance with the present invention is used as a crucible in which a compound semiconductor is grown or a metal is evaporated, the contamination of molten mass with impurities or foreign matters is eliminated with prolonged lifetime. Where it is used as a boat or other jigs in which a compound semiconductor is grown, the lifetime of such a boat or jig can be prolonged by the advantageous influence provided by the improvement in thermal shock resistance. When used as a material for a support rod for supporting a travelling wave tube, the strength and stability are improved and the yield of the product in the production process is increased. In use for electrically insulating parts, various merits are obtained such that resistance to dielectric breakdown is improved since a more homogeneous structure is formed with the decrease of unhomogeneous portions suffering dielectric breakdown.

EXAMPLES OF THE INVENTION

The present invention will now be described with reference to some examples thereof.

EXAMPLE 1

(Run Nos. 1 and 2)

Using six graphite plates each having dimensions of 10 cm width × 60 cm length × 1 cm thickness, a hexagonal reaction chamber was formed on the top face of a 30 cm diameter graphite plate (forming the bottom of the reaction chamber). A throughhole was pierced at the center of the bottom plate, and two graphite tubes coated preliminarily with pyrolytic boron nitride were connected to the chamber for introducing therethrough the starting material gases and arranged concentrically. A graphite mold having a contour for forming the interior wall of a crucible and having a diameter of 96 mm and a length of 110 mm was suspended from the top of the hexagonal reaction chamber, and the entire reaction chamber was put into a vacuum furnace. After evacuating the furnace to $10^{-2}$ Torr, the temperature in the furnace was raised to 1875° C. At that time, the temperature of the starting material gas introduction tube was 200° C. at the inlet of the heating furnace and 1850° C. at the inlet of the reaction chamber. A boron trichloride gas diluted with nitrogen and an ammonia gas were introduced into the chamber under a pressure of 0.5 Torr for effecting deposition for a pre-set time period, followed by cooling, and then the formed pyrolytic boron nitride mass was separated from the graphite mold to obtain a 1 mm thich pyrolytic boron nitride crucible. The upper end of the crucible was cut by about 20 mm to form a 4 inch diameter pyrolytic boron nitride crucible. No nodule was observed on the peripheral wall of the crucible, and five nodules distributed uniformly and each having a diameter of about 500 μm were found on the bottom of the crucible. The number of nodules present per unit area was 0.014/cm$^2$, and there was found no region where 2 or more nodules were present in 1 cm square area. The nodules on the surface of the crucible were ground off to prepare a crucible having a smooth surface (Run No. 1: Example of the invention).

For comparison purpose, another pyrolytic boron nitride crucible (Run No. 2, Comparative Example) was fabricated similarly as in Example 1 except that the starting material gas introduction tubes were made of graphite which was not coated with pyrolytic boron nitride. The thus fabricated crucible had 235 nodules on the bottom and 46 nodules on the peripheral wall, the diameter of each nodule being not less than 100 $\mu$m. Namely, 0.8/cm$^2$ of nodules was present in average, and the maximum number of nodules present in a 1 cm square area was 13/cm$^2$.

The aforementioned two pyrolytic boron nitride crucibles were subjected to lifetime test, the conditions of which were determined in consideration that the crucibles were used in the Liquid Encapsulated Czochralski Method for growing therein GaAs single crystals. In detail, 200 g of B$_2$O$_3$ was melted in each of the crucibles at 1300° C. in an argon atmosphere, and then cooled to the room temperature. B$_2$O$_3$ adhered over the interior wall of each crucible. The entire mass of the crucible was dipped in methanol through which ultrasonic waver were flowed to impregnate methanol into the interface between the adhering B$_2$O$_3$ and the pyrolytic boron nitride layer to separate the substantial portion of B$_2$O$_3$, followed by removing the adhering blocks of B$_2$O$_3$ left on the interior wall of the pyrolytic boron nitride crucible. The aforementioned procedure was repeated, and the fatigue or abrasion of the crucible after each test cycle was inspected. After almost every cycle, some portions of B$_2$O$_3$ were left unremoved even by the aforementioned methanol dipping processing, and portions of the interior wall of the pyrolytic boron nitride crucible were peeled off little by little. Such peeling-off occurred at the portions about the areas where nodules were locally concentrated for the crucible of Comparative Example (Run No. 2), to result in removal of relatively thick and large masses by every operation cycle, and the bottom of the crucible was broken at the thirteenth cycle.

On the other hand, for the crucible of the invention (Run No. 1), portions on which B$_2$O$_3$ spots still adhered after the methanol processing were small both in area and number. Sometimes, no peeling-off of the interior wall of the pyrolytic boron nitride crucible occurred. Even if some portions were peeled off, the damages caused thereby were small in thickness and number. The crucible fabricated by the present invention could be used after 30 test cycles.

EXAMPLE 2

(Run Nos. 3 and 4)

Similarly as in Example 1, a plate made of pyrolytic boron nitride and having the dimensions of 12.7 mm $\times$ 254 mm $\times$ 1.65 mm was deposited on a graphite mold plate (Run No. 3). Three nodules each having a diameter of about 300 $\mu$m were found on the pyrolytic boron nitride plate, but the nodules were separated from each other by more than 3 cm spacings. The average number of nodules per unit area was 0.1/cm$^2$. Using a diamond cutter having a cut edge width of 0.5 mm, six pyrolytic boron nitride rods, each having the dimensions of 1.65 mm $\times$ 1.65 mm $\times$ 254 mm, were cut out.

Each rod was supported b a span of 220 mm, and the center portion of the spanned rod was warped by the dislocation amount of 20 mm, the warping load being applied perpendicularly to the laminated layers. No one of the tested six rods was broken.

A commercially available pyrolytic boron nitride plate (Run No. 4) having the same dimensions was procured and used in the following comparison test. Twenty-four traces of nodules each having a diameter of more than 100 $\mu$m were found on the procured commercial product. The average number of the nodule traces was 0.65/cm$^2$. Generally in accordance with the procedure as described in the preceding paragraph, six pyrolytic boron nitride rods each having the dimensions of 1.65 mm $\times$ 1.65 mm $\times$ 254 mm were cut out, and subjected to tests where each test specimen was formed with warping of the same extent as described in the preceding paragraph. The results were that two of the six rods were broken. The broken specimens were observed through a microscope to find that each rod was broken at a portion where a nodule was present. The results revealed that the breakdown was due to a nodule or trace thereof.

EXAMPLE 3

(Run Nos. 5, 6 and 7)

Using six graphite plates each having dimensions of 10 cm width $\times$ 60 cm length $\times$ 1 cm thickness, a hexagonal reaction chamber was formed on the top face of a 30 cm diameter graphite plate (forming the bottom of the reaction chamber). A throughhole was pierced at the center of the bottom plate, and two graphite tubes coated preliminarily with pyrolytic boron nitride were connected to the chamber for introducing therethrough the starting material gases and arranged concentrically. A graphite mold having a contour for forming the interior wall of a crucible and having a diameter of 96 mm and a length of 11 mm was suspended from the top of the hexagonal reaction chamber, and the entire reaction chamber was put into a vacuum furnace. After evacuating the furnace to 10$^{-2}$ Torr, the temperature in the furnace was raised to the deposition temperature. While maintaining the pressure in the reaction chamber at 0.75 Torr, boron trichloride gas diluted with nitrogen gas and an ammonia gas were introduced to allow them to react with each other so that pyrolytic boron nitride was deposited on the graphite mold. After cooling, the formed pyrolytic boron nitride laminate coating was separated from the mold to obtain a crucible made of pyrolytic boron nitride and having a thickness of about 1 mm.

Changing the deposition temperature for depositing pyrolytic boron nitride and varying the feed rates of the starting material gases per unit time, three pyrolytic boron nitride crucibles (Run No. 5, 6 and 7) were fabricated. To learn the properties of each of the three crucibles, the C-axis lattice constant (C$_0$) of pyrolytic boron nitride and the crystal grain size (Lc) in the direction of C-axis were determined through X-ray diffractometry, the density (d) was measured by the Archimedes' method, and the content of silicon in each crucible was determined by emission spectrometry.

After grinding the inner surface of each of the crucibles fabricated under the same conditions, using #500 emery paper, to grind off about 50 $\mu$m depth, each crucible was rinsed with ethanol and then dried. In each of the crucibles, single crystals of GaAs were grown repeatedly through the Liquid Encapsulated Czochralski Method while using $B_2O_3$ as the encapsulant, until the crucible used had been broken. The cycle number conducted before the breakdown of respective crucibles, and the average specific resistivities of individual GaAs single crystals grown in respective crucibles are shown in Table 1. The number of nodules present per unit area is also shown in Table 1. Incidentally, there was not any portion where more than 2 nodules were present in the unit square centimeter.

Tests were repeated three times in accordance with similar procedures to obtain the same results.

TABLE 1

| Run No. | Deposition Temperature (°C.) | $C_o$ (Å) | Lc (Å) | d (g/cm³) | Content of Si (ppm) | Durable Lifetime (time) | Specific Resistivity (Ω · cm) | Nodule (No./cm²) |
|---|---|---|---|---|---|---|---|---|
| 5 | 1920 | 6.84 | 55 | 2.14 | 1 | 28 | $\geq 3 \times 10^3$ | 0.017 |
| 6 | 1850 | 6.90 | 20 | 2.10 | 50 | 21 | $1 \times 10^3$ | 0.014 |
| 7 | 1830 | 6.92 | <10 | 2.01 | 150 | 14 | $8 \times 10^5$ | 0.014 |

It will be seen from Table 1 that the pyrolytic boron nitride crucibles of the invention have long lifetimes and that the specific resistivities of GaAs single crystals grown in the crucibles of the invention are not less than $1 \times 10^8$ which may be said as semi-insulating.

EXAMPLE 4

(Run Nos. 8 to 15)

Using the same reaction chamber and under the same deposition pressure as in Example 3, while changing the reaction temperature and the deposition rate, six pyrolytic boron nitride crucibles (Run Nos. 8, 9, 10, 11, 12 and 13) were prepared. Also, two commercially available crucibles were procured and subjected to tests as comparative examples (Run Nos. 14 and 15).

The Vickers hardness Hv and the lengths of crackings of each crucible were measured using a Vickers' hardness tester following the procedures as described before. The tester used was Micro-hardness Tester "Model MVK" available from Akashi-seisakusho K. K.

Similarly as in Examples 1 and 3, each crucible was subjected to repeated cycles where $B_2O_3$ was melted and then cooled, the lifetime of each crucible was determined by repeating the test cycles until it was broken. The results are shown in Table 2. The number of nodules is also shown in Table 2. Incidentally, there was not any portion where more than 2 nodules were present in the unit square centimeter.

TABLE 2

| | Run No. | Reaction Temperature (°C.) | Deposition Rate (μm/hr) | Hv (0.2/15) | Length of Cracking (μm) | Durable Lifetime (time) | Nodule (No./cm²) |
|---|---|---|---|---|---|---|---|
| Example | 8 | 1950 | 72.3 | 52.3 | 138 | 32 | 0.017 |
| | 9 | 1950 | 167 | 59.4 | 135 | 28 | 0.014 |
| | 10 | 1920 | 144 | 56.4 | 73 | 31 | 0.014 |
| | 11 | 1950 | 310 | 63.1 | 485 | 16 | 0.011 |
| | 12 | 1900 | 160 | 68.3 | 312 | 14 | 0.017 |
| | 13 | 1920 | 230 | 75.1 | 330 | 14 | 0.008 |
| Commercial Product | 14 | — | — | 72.9 | 311 | 11 | 0.647 |
| | 15 | — | — | 62.5 | 313 | 8 | 0.818 |

As seen from the results set forth in Table 2, commercial products are considerably larger in Vickers hardness and length of cracking and have shorter lifetime as compared with those of the examples of the invention.

EXAMPLE 5

(Run Nos. 16 to 21)

Using the same reaction chamber as used in Example 3, six crucibles were fabricated (Run Nos. 16, 17, 18, 19, 20 and 21), while varying the deposition pressure and temperature. The lifetimes of respective samples were determined by the same manner as adopted in Examples 1, 3 and 4 while using $B_2O_3$. The C-axis lattice constant ($C_0$) of each of the six crucibles was determined through the X-ray diffraction technique, the samples of the crucibles were photographed through a microscope to observe the interlaminar surface thereof and to measure the diameters of individual microscopic dome-like structures, and the minimum diameter (D) was determined from the results thereof. The results are shown in Table 3. Incidentally, there was not any portion where more than 2 nodules were present in the unit square centimeter.

TABLE 3

| | Run No. | Reaction Temperature (°C.) | Pressure (Torr) | Deposition Rate (μm/hr) | $C_o$ (Å) | D (μm) | Durable Lifetime (time) | Nodule (No./cm²) |
|---|---|---|---|---|---|---|---|---|
| Example | 16 | 1920 | 0.75 | 77 | 6.68 | 1.2 | 41 | 0.014 |
| | 17 | 1900 | 1.2 | 82 | 6.78 | 1.5 | 36 | 0.011 |
| | 18 | 1950 | 2.0 | 110 | 6.72 | 0.9 | 32 | 0.014 |
| | 19 | 1840 | 0.75 | 120 | 6.92 | 0.2 | 15 | 0.011 |
| | 20 | 1900 | 25 | 200 | 6.85 | 0.1 | 14 | 0.008 |
| | 21 | 1930 | 1.6 | 320 | 6.90 | <0.1 | 14 | 0.014 |

EXAMPLE 6

(Run Nos. 22, 23 and 24)

Three pyrolytic boron nitride crucibles (Thickness: 1mm) were fabricated under the same conditions as in Example 1. The inner surfaces of the crucibles were ground, respectively, by #500, #1500 and #40 emery paper sheets so that the three crucibles had different surface roughness ($R_{max}$). The crucibles were subjected to the lifetime test conducted similarly as in Examples 1, 3, 4 and 5 while using $B_2O_3$. The results are shown in Table 4. Incidentally, there was not any portion where more than 2 nodules were present in the unit square centimeter.

TABLE 4

|  | Run No. | $R_{max}$ (μm) | Thickness of Wall Peeled by First Cycle (μm) | Durable Lifetime (time) | Nodule (No./cm²) |
|---|---|---|---|---|---|
| Example | 22 | 50 | 40 | 20 | 0.011 |
|  | 23 | 10 | 25 | 25 | 0.008 |
|  | 24 | 360 | 150 | 15 | 0.011 |

Although the present invention has been described with reference to the specific examples, it should be understood that various modification and variations can be easily made by those skilled in the art without departing from the spirit of the invention. Accordingly, the foregoing disclosure should be interpreted as illustrative only and not to be interpreted in a limiting sense. The present invention is limited only by the scope of the following claims.

What is claimed is:

1. A method for producing a pyrolytic boron nitride article of uniform structure, comprising reacting a boron halide and ammonia in vapor phase, depositing pyrolytic boron nitride from the vapor phase at a temperature of from 1850° C. to 2100° C. onto a substrate conforming to the shape of the article in a reactor made of graphite so that said ammonia or a mixture containing said boron halide and ammonia is not contacted directly with said graphite surfaces at a temperature from 300° C. to 1850° C. before said ammonia or mixture is reacted to form boron nitride at said temperature of from 1850° C. to 2100° C. and removing from the substrate the article thereby formed.

2. The method for producing a pyrolytic boron nitride article according to claim 1, wherein said article is a crucible used for growing therein a semiconductor selected from the compounds of Group II–Group VI metal elements and Group III–Group V metal elements where the Groups II, III, V and VI stands for the Groups in the periodic table.

3. The method for producing a pyrolytic boron nitride article to claim 2, wherein said substrate is made of graphite is cooled to room temperature before being removed from said graphite substrate.

4. The method for producing a pyrolytic boron nitride article according to claim 3, wherein said graphite substrate contains not more than 0.1 wt % of ash.

5. The method for producing a pyrolytic boron nitride article according to claim 1, wherein said boron halide gas has a purity of not less than 99.9%.

6. The method for producing a pyrolytic boron nitride article according to claim 2, wherein said pyrolytic boron nitride is deposited at a deposition temperature of not lower than 1850° C. and at a deposition rate of not more than 400 μm/hr.

7. The method for producing a pyrolytic boron nitride article according to claim 2, wherein said pyrolytic boron nitride is deposited at a deposition temperature of not lower than 1900° C. and at a deposition rate of not more than 300 μm/hr.

8. The method for producing a pyrolytic boron nitride article according to claim 7, wherein said pyrolytic boron nitride is deposited at a deposition pressure of not higher than 20 Torr.

* * * * *